(12) United States Patent
Ikeda et al.

(10) Patent No.: US 9,931,716 B2
(45) Date of Patent: Apr. 3, 2018

(54) SOLDER ALLOY, SOLDER COMPOSITION, SOLDER PASTE, AND ELECTRONIC CIRCUIT BOARD

(71) Applicant: HARIMA CHEMICALS, INCORPORATED, Kakogawa-shi, Hyogo (JP)

(72) Inventors: Kazuki Ikeda, Hyogo (JP); Kosuke Inoue, Hyogo (JP); Kazuya Ichikawa, Hyogo (JP); Tadashi Takemoto, Ibaraki (JP)

(73) Assignee: HARIMA CHEMICALS, INCORPORATED, Kakogawa-Shi, Hyogo (JP)

( * ) Notice: Subject to any disclaimer, the term of this patent is extended or adjusted under 35 U.S.C. 154(b) by 0 days.

(21) Appl. No.: 14/442,628

(22) PCT Filed: Aug. 28, 2014

(86) PCT No.: PCT/JP2014/072575
§ 371 (c)(1),
(2) Date: May 13, 2015

(87) PCT Pub. No.: WO2015/198496
PCT Pub. Date: Dec. 30, 2015

(65) Prior Publication Data
US 2016/0271737 A1 Sep. 22, 2016

(30) Foreign Application Priority Data

Jun. 24, 2014 (JP) .................. 2014-129472

(51) Int. Cl.
| | |
|---|---|
| *C22C 13/02* | (2006.01) |
| *B23K 35/26* | (2006.01) |
| *C22C 13/00* | (2006.01) |
| *B23K 35/02* | (2006.01) |
| *B23K 35/22* | (2006.01) |
| *B23K 35/36* | (2006.01) |
| *H05K 3/34* | (2006.01) |
| *B23K 35/362* | (2006.01) |
| *B23K 101/36* | (2006.01) |
| *B23K 101/42* | (2006.01) |

(52) U.S. Cl.
CPC .......... *B23K 35/262* (2013.01); *B23K 35/025* (2013.01); *B23K 35/0205* (2013.01); *B23K 35/0227* (2013.01); *B23K 35/0244* (2013.01); *B23K 35/22* (2013.01); *B23K 35/26* (2013.01); *B23K 35/36* (2013.01); *B23K 35/362* (2013.01); *B23K 35/3606* (2013.01); *B23K 35/3612* (2013.01); *B23K 35/3613* (2013.01); *B23K 35/3616* (2013.01); *B23K 35/3618* (2013.01); *C22C 13/00* (2013.01); *C22C 13/02* (2013.01); *H05K 3/3484* (2013.01); *B23K 2201/36* (2013.01); *B23K 2201/42* (2013.01); *H05K 3/3457* (2013.01)

(58) Field of Classification Search
CPC .................. C22C 13/00; C22C 13/02
See application file for complete search history.

(56) References Cited

U.S. PATENT DOCUMENTS

| | | | |
|---|---|---|---|
| 5,733,501 A | 3/1998 | Takao et al. | |
| 6,176,947 B1 | 1/2001 | Hwang et al. | |
| 6,224,690 B1 | 5/2001 | Andricacos et al. | |
| 6,367,683 B1 | 4/2002 | Rass et al. | |
| 8,598,464 B2 * | 12/2013 | Sakatani | B23K 35/262 174/260 |
| 9,445,508 B2 * | 9/2016 | Nakanishi | C22C 13/00 |
| 2003/0015575 A1 | 1/2003 | Yamaguchi et al. | |
| 2008/0292492 A1 | 11/2008 | Ingham et al. | |
| 2009/0232696 A1 | 9/2009 | Ohnishi et al. | |
| 2010/0084050 A1 | 4/2010 | Kraemer et al. | |
| 2010/0294565 A1 | 11/2010 | Kawamata et al. | |
| 2010/0307823 A1 | 12/2010 | Kawamata et al. | |
| 2011/0120769 A1 | 5/2011 | Sakatani et al. | |

(Continued)

FOREIGN PATENT DOCUMENTS

| | | |
|---|---|---|
| CN | 1392817 A | 1/2003 |
| CN | 101537545 A | 9/2009 |

(Continued)

OTHER PUBLICATIONS

International Search Report (PCT/ISA/210) dated Oct. 7, 2014, by the Japanese Patent Office as the International Searching Authority for International Application No. PCT/JP2014/072576.

Written Opinion (PCT/ISA/237) dated Oct. 7, 2014, by the Japanese Patent Office as the International Searching Authority for International Application No. PCT/JP2014/072576.

PCT International Preliminary Report on Patentability (IPRP) and Written Opinion dated Dec. 27, 2016, in corresponding International Application No. PCT/JP2014/072575 (10 pages).

*Primary Examiner* — Roy King
*Assistant Examiner* — Jophy S Koshy
(74) *Attorney, Agent, or Firm* — Buchanan, Ingersoll & Rooney PC

(57) ABSTRACT

A solder alloy is a tin-silver-copper solder alloy substantially consisting of tin, silver, copper, bismuth, nickel, cobalt, and indium. With respect to the total amount of the solder alloy, the content ratio of the silver is 2 mass % or more and 5 mass % or less; the content ratio of the copper is 0.1 mass % or more and 1 mass % or less; the content ratio of the bismuth is 0.5 mass % or more and 4.8 mass % or less; the content ratio of the nickel is 0.01 mass % or more and 0.15 mass % or less; the content ratio of the cobalt is 0.001 mass % or more and 0.008 mass % or less; the content ratio of the indium is above 6.2 mass % and 10 mass % or less; and the content ratio of the tin is the remaining ratio.

2 Claims, No Drawings

(56) References Cited

U.S. PATENT DOCUMENTS

| | | |
|---|---|---|
| 2012/0018048 A1 | 1/2012 | Yamashita et al. |
| 2012/0175020 A1 | 7/2012 | Imamura et al. |
| 2013/0327444 A1 | 12/2013 | Sawamura et al. |
| 2014/0112710 A1 | 4/2014 | Albrecht et al. |
| 2015/0136461 A1 | 5/2015 | Imamura et al. |
| 2015/0305167 A1* | 10/2015 | Nakanishi ............... C22C 13/00 174/257 |

FOREIGN PATENT DOCUMENTS

| | | | |
|---|---|---|---|
| CN | 103341699 A | 10/2013 | |
| EP | 1614500 A1 | 1/2006 | |
| EP | 2422918 A1 | 2/2012 | |
| JP | 6-344180 A | 12/1994 | |
| JP | 9-70687 A | 3/1997 | |
| JP | 2003-126987 A | 5/2003 | |
| JP | 2004-188453 A | 7/2004 | |
| JP | 2008-521619 A | 6/2006 | |
| JP | 2008-168322 A | 7/2006 | |
| JP | 4428448 B2 | 3/2010 | |
| JP | 2012-106280 A | 6/2012 | |
| JP | 5238088 B1 | 7/2013 | |
| JP | 2013-193092 A | 9/2013 | |
| JP | 5349703 B1 * | 11/2013 | ............. C22C 13/00 |
| JP | 2013-252548 A | 12/2013 | |
| JP | 2014-008523 A | 1/2014 | |
| JP | 2014-37005 A | 2/2014 | |
| JP | 5590272 B1 | 9/2014 | |
| TW | 201410374 A | 3/2014 | |
| WO | WO 98/48069 A1 | 10/1998 | |
| WO | WO 02/40213 A1 * | 5/2002 | ........... B23K 35/262 |
| WO | WO 2008/004531 A2 | 1/2008 | |
| WO | WO 2009/011341 A1 | 1/2009 | |
| WO | WO 2009/011392 A1 | 1/2009 | |
| WO | WO 2010/122764 A1 | 10/2010 | |
| WO | WO 2012/056753 A1 | 5/2012 | |
| WO | WO 2012/115268 A1 | 8/2012 | |
| WO | WO 2012/127642 A1 | 9/2012 | |
| WO | WO 2013/017885 A2 | 2/2013 | |
| WO | WO 2014/002303 A1 | 1/2014 | |
| WO | WO 2014/013632 A1 | 1/2014 | |
| WO | WO 2014/013847 A1 | 1/2014 | |

* cited by examiner

SOLDER ALLOY, SOLDER COMPOSITION, SOLDER PASTE, AND ELECTRONIC CIRCUIT BOARD

TECHNICAL FIELD

The present invention relates to a solder alloy, a solder composition, a solder paste, and an electronic circuit board, to be specific, to a solder alloy, a solder composition, a solder paste containing the solder alloy and/or the solder composition, and furthermore, an electronic circuit board obtained by using the solder paste.

BACKGROUND ART

In metal connection in electrical and electronic devices or the like, solder connection using a solder paste has been generally used and in such a solder paste, a solder alloy containing lead has been conventionally used.

However, in view of environmental load, the use of lead has been recently required to be suppressed and thus, the development of a solder alloy without containing lead (lead-free solder alloy) has been promoted.

As such a lead-free solder alloy, for example, a tin-copper alloy, a tin-silver-copper alloy, a tin-bismuth alloy, and a tin-zinc alloy have been well known and among all, a tin-silver-copper alloy has been widely used for its excellent strength.

As such a tin-silver-copper solder alloy, for example, a solder alloy containing silver at a ratio of 2 to 4 mass %, copper at a ratio of 0.1 to 1 mass %, bismuth at a ratio of 0.5 to 4.8 mass %, nickel at a ratio of 0.01 to 0.15 mass %, cobalt at a ratio of 0.001 to 0.008 mass %, furthermore, indium at a ratio of 2.2 to 6.2 mass %, and tin as a remaining content has been proposed (ref: Patent Document 1).

Such a solder alloy has a low melting point; has excellent mechanical properties such as durability, crack resistance, and erosion resistance; and furthermore, is capable of suppressing the occurrence of a void (gap).

PRIOR ART DOCUMENT

Patent Document

Patent Document 1: U.S. Pat. No. 5,349,703 in Patent Gazette

SUMMARY OF THE INVENTION

Problems to be Solved by the Invention

Meanwhile, a component (circuit board etc.) soldered with such a solder alloy has a possibility of causing damage by being repeatedly exposed to a heated state or a cooled state. Thus, the solder alloy has been required to suppress the breakage of the component after soldering.

It is an object of the present invention to provide a solder alloy and a solder composition capable of having excellent mechanical properties such as durability, crack resistance, and erosion resistance and furthermore, capable of suppressing the breakage of components; a solder paste containing the solder alloy and/or the solder composition; and furthermore, an electronic circuit board obtained by using the solder paste.

Solution to the Problems

A solder alloy according to one aspect of the present invention is a tin-silver-copper solder alloy substantially consisting of tin, silver, copper, bismuth, nickel, cobalt, and indium, wherein with respect to the total amount of the solder alloy, the content ratio of the silver is 2 mass % or more and 5 mass % or less; the content ratio of the copper is 0.1 mass % or more and 1 mass % or less; the content ratio of the bismuth is 0.5 mass % or more and 4.8 mass % or less; the content ratio of the nickel is 0.01 mass % or more and 0.15 mass % or less; the content ratio of the cobalt is 0.001 mass % or more and 0.008 mass % or less; the content ratio of the indium is above 6.2 mass % and 10 mass % or less; and the content ratio of the tin is the remaining ratio.

In the solder alloy of the present invention, it is preferable that antimony is further contained and with respect to the total amount of the solder alloy, the content ratio of the antimony is 0.4 mass % or more and 10 mass % or less.

A solder composition according to another aspect of the present invention consists of a tin-silver-copper solder alloy and metal oxide and/or metal nitride, wherein the solder alloy substantially consists of tin, silver, copper, bismuth, nickel, cobalt, and indium and with respect to the total amount of the solder composition, the content ratio of the silver is 2 mass % or more and 5 mass % or less; the content ratio of the copper is 0.1 mass % or more and 1 mass % or less; the content ratio of the bismuth is 0.5 mass % or more and 4.8 mass % or less; the content ratio of the nickel is 0.01 mass % or more and 0.15 mass % or less; the content ratio of the cobalt is 0.001 mass % or more and 0.008 mass % or less; the content ratio of the indium is above 6.2 mass % and 10 mass % or less; the content ratio of the metal oxide and/or the metal nitride is above 0 mass % and 1.0 mass % or less; and the content ratio of the tin is the remaining ratio.

In the solder composition of the present invention, it is preferable that antimony is further contained and with respect to the total amount of the solder composition, the content ratio of the antimony is 0.4 mass % or more and 10 mass % or less.

A solder paste according to another aspect of the present invention contains a solder powder composed of the above-described solder alloy and flux.

A solder paste according to another aspect of the present invention contains a solder powder composed of the above-described solder composition and flux.

An electronic circuit board according to further another aspect of the present invention includes a soldering portion by the above-described solder paste.

Effect of the Invention

In the tin-silver-copper solder alloy consisting of tin, silver, copper, bismuth, nickel, cobalt, and indium, the content ratio of the indium is adjusted, so that the solder alloy and the solder composition according to one aspect of the present invention are capable of having excellent mechanical properties such as durability, crack resistance, and erosion resistance and furthermore, capable of suppressing the breakage of components.

The solder alloy and/or the solder composition described above are/is contained, so that the solder paste according to another aspect of the present invention is capable of having excellent mechanical properties such as durability, crack resistance, and erosion resistance and furthermore, capable of suppressing the breakage of components.

The above-described solder paste is used in soldering, so that in its soldering portion, the electronic circuit board according to further another aspect of the present invention is capable of having excellent mechanical properties such as durability, crack resistance, and erosion resistance and furthermore, capable of suppressing the breakage of components.

EMBODIMENT OF THE INVENTION

A solder alloy according to one aspect of the present invention is a tin-silver-copper solder alloy and contains, as essential components, tin, silver, copper, bismuth, nickel, cobalt, and indium. In other words, the solder alloy substantially consists of tin, silver, copper, bismuth, nickel, cobalt, and indium. In the specification, "substantially" means that allowing the above-described elements to be essential components and an optional component to be described later to be contained at a proportion to be described later.

In the solder alloy, the content ratio of the tin is the remaining ratio of each of the components to be described later and is appropriately set in accordance with the mixing amount of each of the components.

The content ratio of the silver is, for example, 2 mass % or more, preferably above 2 mass %, or more preferably 2.5 mass % or more, and, for example, 5 mass % or less, preferably 4 mass % or less, more preferably less than 4 mass %, or further more preferably 3.8 mass % or less with respect to the total amount of the solder alloy.

The content ratio of the silver is set to be within the above-described range, so that the above-described solder alloy is capable of having excellent erosion resistance, excellent durability, and excellent crack resistance and furthermore, capable of suppressing the breakage of components.

On the other hand, when the content ratio of the silver is less than the above-described lower limit, durability is poor and the exhibition in effect (erosion resistance) due to copper to be described later is inhibited. When the content ratio of the silver is above the above-described upper limit, the mechanical properties such as crack resistance decrease. Furthermore, excess of silver inhibits the exhibition in effect (durability) of cobalt to be described later and in addition, suppression performance in breakage of components is poor.

The content ratio of the copper is, for example, 0.1 mass % or more, preferably 0.3 mass % or more, or more preferably 0.4 mass % or more, and, for example, 1 mass % or less, preferably 0.7 mass % or less, or more preferably 0.6 mass % or less with respect to the total amount of the solder alloy.

When the content ratio of the copper is within the above-described range, excellent erosion resistance, excellent durability, and excellent crack resistance can be obtained and furthermore, the breakage of components can be suppressed.

On the other hand, when the content ratio of the copper is less than the above-described lower limit, crack resistance and durability are poor and furthermore, erosion resistance is poor, so that copper erosion or the like may occur. That is, when the content ratio of the copper is less than the above-described lower limit, a copper pattern or a through hole in an electronic circuit board may be fused (subjected to copper erosion) by the solder alloy at the time of soldering using the solder alloy. When the content ratio of the copper is above the above-described upper limit, durability (among all, cooling/heating fatigue resistance) and crack resistance are poor and furthermore, suppression performance in breakage of components is poor.

The content ratio of the bismuth is, for example, 0.5 mass % or more, preferably 0.8 mass % or more, more preferably 1.2 mass % or more, further more preferably 1.8 mass % or more, or particularly preferably 2.2 mass % or more, and, for example, 4.8 mass % or less, preferably 4.2 mass % or less, more preferably 3.5 mass % or less, or further more preferably 3.0 mass % or less with respect to the total amount of the solder alloy.

When the content ratio of the bismuth is within the above-described range, excellent erosion resistance, excellent durability, and excellent crack resistance can be obtained and furthermore, the breakage of components can be suppressed.

On the other hand, when the content ratio of the bismuth is less than the above-described lower limit, durability is poor. When the content ratio of the bismuth is above the above-described upper limit, suppression performance in breakage of components is poor and furthermore, crack resistance and durability may be poor.

The content ratio of the nickel is, for example, 0.01 mass % or more, preferably 0.03 mass % or more, or more preferably 0.04 mass % or more, and, for example, 0.15 mass % or less, preferably 0.1 mass % or less, or more preferably 0.06 mass % or less with respect to the total amount of the solder alloy.

When the content ratio of the nickel is within the above-described range, the refinement of solder structure can be achieved and the improvement of crack resistance and durability can be achieved. Furthermore, excellent erosion resistance can be achieved and the breakage of components can be suppressed.

On the other hand, when the content ratio of the nickel is less than the above-described lower limit, erosion resistance and crack resistance are poor and furthermore, the refinement of solder structure cannot be achieved, so that durability may be poor. When the content ratio of the nickel is above the above-described upper limit, crack resistance and suppression performance in breakage of components are poor and furthermore, durability may be poor.

The content ratio of the cobalt is, for example, 0.001 mass % or more, preferably 0.003 mass % or more, or more preferably 0.004 mass % or more, and, for example, 0.008 mass % or less, or preferably 0.006 mass % or less with respect to the total amount of the solder alloy.

When the solder alloy contains cobalt, in a solder paste obtained from the solder alloy, an intermetallic compound layer (e.g., Sn—Cu, Sn—Co, Sn—Cu—Co, etc.) formed in the soldering interface becomes thick and difficult to grow by a thermal load or a load based on thermal change. Also, the cobalt is dispersed and deposited in the solder, so that the solder can be reinforced.

When the solder alloy contains the cobalt at the above-described proportion, the refinement of solder structure can be achieved and the improvement of crack resistance and durability can be achieved. Furthermore, excellent erosion resistance can be achieved and the breakage of components can be suppressed. On the other hand, when the content ratio of the cobalt is less than the above-described lower limit, erosion resistance is poor and furthermore, the refinement of solder structure cannot be achieved, so that crack resistance is poor and in addition, durability may be poor. When the content ratio of the cobalt is above the above-described upper limit, crack resistance and suppression performance in breakage of components are poor and furthermore, durability may be poor.

The mass ratio (Ni/Co) of nickel content with respect to cobalt content is, for example, 1 or more, preferably 5 or more, or more preferably 8 or more, and, for example, 200 or less, preferably 100 or less, more preferably 50 or less, further more preferably 20 or less, or particularly preferably 12 or less.

When the mass ratio (Ni/Co) of nickel to cobalt is within the above-described range, the refinement of solder structure can be achieved and excellent crack resistance and excellent durability can be ensured. Furthermore, excellent erosion resistance can be achieved and the breakage of components can be suppressed.

On the other hand, when the mass ratio (Ni/Co) of nickel to cobalt is less than the above-described lower limit, the refinement of solder structure cannot be achieved and there may be a case where crack resistance is poor and the occurrence of a void cannot be suppressed. Also, when the mass ratio (Ni/Co) of nickel to cobalt is not less than the above-described upper limit, the refinement of solder structure cannot be achieved and crack resistance may be poor.

The content ratio of the indium is, for example, above 6.2 mass %, preferably 6.5 mass % or more, or more preferably 7.0 mass % or more, and, for example, 10 mass % or less, preferably 9.0 mass % or less, more preferably 8.5 mass % or less, or particularly preferably 8.0 mass % or less with respect to the total amount of the solder alloy.

When the content ratio of the indium is within the above-described range, excellent crack resistance, excellent durability, and excellent erosion resistance can be ensured and furthermore, the breakage of soldered components can be suppressed.

To be specific, the solder alloy contains tin and silver, so that an $Ag_3Sn$ (three silver tin) structure usually exists therein. By allowing the temperature repeatedly to go up and down, such an $Ag_3Sn$ structure aggregates and may cause a crack.

On the contrary, when the indium is contained in the solder alloy at the above-described proportion, the aggregation of $Ag_3Sn$ is inhibited and the refinement of $Ag_3Sn$ structure can be achieved, so that the improvement of crack resistance can be achieved.

Furthermore, although a component (circuit board etc.) soldered with such a solder alloy has a possibility of causing damage by being repeatedly exposed to a heated state or a cooled state, when the indium is contained in the solder alloy at the above-described proportion, the breakage of the component can be excellently suppressed.

The above-described mechanism is presumed by the inventors of the present invention and accordingly, the present invention is not limited to the above-described mechanism.

On the other hand, when the content ratio of the indium is not more than the above-described lower limit, suppression performance in breakage of components is poor. When the content ratio of the indium is above the above-described upper limit, durability and crack resistance are poor.

The mass ratio (In/Bi) of indium content with respect to bismuth content is, for example, 1.0 or more, preferably 1.5 or more, or more preferably 2.0 or more, and, for example, 16 or less, preferably 14 or less, more preferably 10 or less, or particularly preferably 7.0 or less.

When the mass ratio (In/Bi) of indium to bismuth is within the above-described range, excellent erosion resistance, excellent durability, and excellent crack resistance can be obtained and furthermore, the breakage of components can be suppressed.

On the other hand, when the mass ratio (In/Bi) of indium to bismuth is less than the above-described lower limit, crack resistance may be poor. Also, when the mass ratio (In/Bi) of indium to bismuth is above the above-described upper limit, crack resistance may be poor.

The above-described solder alloy can further contain antimony or the like as an optional component.

The content ratio of the antimony is, for example, 0.4 mass % or more, preferably 1.0 mass % or more, or more preferably 1.5 mass % or more, and, for example, 10 mass % or less, preferably 5.0 mass % or less, more preferably 4.5 mass % or less, or further more preferably 4.0 mass % or less with respect to the total amount of the solder alloy.

When the content ratio of the antimony is within the above-described range, excellent erosion resistance, excellent durability, and excellent crack resistance can be obtained and furthermore, the breakage of components can be suppressed. On the other hand, when the content ratio of the antimony is less than the above-described lower limit, durability may be poor. Also, when the content ratio of the antimony is above the above-described upper limit, durability may be poor.

When the content ratio of the antimony is within the above-described range, the content ratio of the bismuth is, for example, 0.5 mass % or more, preferably 0.8 mass % or more, or more preferably 1.2 mass % or more, and, for example, 4.2 mass % or less, preferably 3.5 mass % or less, or more preferably 3.0 mass % or less.

When the content ratio of the antimony and that of the bismuth are within the above-described range, excellent erosion resistance, excellent durability, and excellent crack resistance can be obtained and furthermore, the breakage of components can be suppressed.

Such a solder alloy can be obtained by alloying the above-described metal components by a known method such as melting the metal components in a melting furnace to be unified.

The above-described metal components used in the production of the solder alloy can contain small amount of impurities (inevitable impurities) as long as the excellent effect of the present invention is not inhibited.

Examples of the impurities include aluminum (Al), iron (Fe), zinc (Zn), and gold (Au).

The melting point of the solder alloy obtained in this manner measured by a DSC method (measurement conditions: temperature rising rate of 0.5° C./min.) is, for example, 190° C. or more, or preferably 200° C. or more, and, for example, 250° C. or less, or preferably 240° C. or less.

When the melting point of the solder alloy is within the above-described range, in a case where the solder alloy is used in the solder paste, metal connection can be easily performed with excellent workability.

The present invention includes a solder composition consisting of the solder alloy and metal oxide and/or metal nitride.

To be more specific, the solder composition of the present invention is obtained by replacing a part of tin in the above-described solder alloy with the metal oxide and/or the metal nitride.

The solder alloy is the same tin-silver-copper solder alloy as the above-described one and contains, as essential components, tin, silver, copper, bismuth, nickel, cobalt, and indium. Also, the solder alloy can contain antimony as an optional component.

The above-described numeral value range is used as the content ratio of each of the components (excluding tin) with respect to the total amount of the solder composition.

Examples of the metal oxide include aluminum oxide (including alumina and hydrate of aluminum oxide), iron oxide, magnesium oxide (magnesia), titanium oxide (titania), cerium oxide (ceria), zirconium oxide (zirconia), and cobalt oxide. Examples of the metal oxide also include composite metal oxide such as barium titanate and furthermore, doped metal oxide obtained by doping a metal ion thereto, such as indium tin oxide and antimony tin oxide. Furthermore, an example of the metal oxide also includes semimetal oxide such as silicon. To be specific, an example thereof includes silicon dioxide.

These metal oxides can be used alone or in combination of two or more.

Example of the metal nitride include aluminum nitride, zirconium nitride, gallium nitride, chromium nitride, tungsten nitride, magnesium nitride, molybdenum nitride, and lithium nitride.

These metal nitrides can be used alone or in combination of two or more.

As the metal oxide and/or the metal nitride, in view of improvement of crack resistance, preferably, metal oxide is used, or more preferably, zirconia is used.

The metal oxide and/or the metal nitride are/is not particularly limited and preferably, powder-shaped metal oxide and/or metal nitride are/is used.

The average particle size of the metal oxide and/or the metal nitride is not particularly limited and is, for example, 1 nm to 50 µm in measurement by using a particle diameter and particle size distribution analyzer by a laser diffraction method.

The content ratio of the metal oxide and/or the metal nitride is, for example, above 0 mass %, preferably 0.0001 mass % or more, more preferably 0.001 mass % or more, or further more preferably 0.01 mass % or more, and, for example, 1.0 mass % or less, preferably 0.8 mass % or less, or more preferably 0.5 mass % or less with respect to the total amount of the solder composition.

When the content ratio of the metal oxide and/or the metal nitride is within the above-described range, the improvement of crack resistance can be excellently achieved.

In the solder composition, the content ratio of the tin is the remaining ratio of the above-described metal components (excluding tin) and the metal oxide and/or the metal nitride and is appropriately set in accordance with the mixing amount of the components.

To obtain the solder composition, although not particularly limited, for example, when the above-described solder alloy is produced, to be specific, when the metal components are melted (fused) in a melting furnace, the metal oxide and/or the metal nitride described above are/is added along with the metal components. In this manner, the solder composition containing the solder alloy and the metal oxide and/or the metal nitride can be obtained.

The method for obtaining the solder composition is not limited to the description above and, for example, the metal oxide and/or the metal nitride and the above-described solder alloy that is separately produced can be also physically mixed.

Preferably, the metal oxide and/or the metal nitride are/is added along with the metal components in the production of the solder alloy.

In the tin-silver-copper solder alloy consisting of tin, silver, copper, bismuth, nickel, cobalt, and indium, the content ratio of the indium is adjusted, so that the solder alloy and the solder composition described above are capable of having excellent mechanical properties such as durability, crack resistance, and erosion resistance and furthermore, capable of suppressing the breakage of components.

Thus, the solder alloy and the solder composition are preferably contained in the solder paste (solder paste connecting material).

To be specific, the solder paste according to another aspect of the present invention contains the solder alloy and/or the solder composition described above and flux.

The solder alloy and/or the solder composition in a powdered shape are/is preferably contained in the solder paste.

The powdered shape is not particularly limited and examples thereof include a substantially complete sphere shape, a flat block shape, a needle shape, and an amorphous shape. The powdered shape is appropriately set in accordance with the properties (e.g., thixotropy, viscosity, etc.) required for the solder paste.

The average particle size (in the case of sphere shape) or the average longitudinal length (in the case of not sphere shape) of the powder of the solder alloy and/or the solder composition is, for example, 5 µm or more, or preferably 15 µm or more, and, for example, 100 µm or less, or preferably 50 µm or less in measurement by using a particle diameter and particle size distribution analyzer by a laser diffraction method.

The flux is not particularly limited and known solder flux can be used.

To be specific, the flux is mainly composed of, for example, a base resin (rosin, acrylic resin, etc.), an activator (e.g., hydrohalogenic acid salt of amine such as ethylamine and propylamine, organic carboxylic acid such as lactic acid, citric acid, and benzoic acid, etc.), and a thixotropic agent (hardened castor oil, bees wax, carnauba wax, etc.) and can further contain an organic solvent when liquid flux is used.

The solder paste can be obtained by mixing the powder composed of the solder alloy and/or the solder composition described above with the above-described flux by a known method.

The mixing ratio of the solder alloy and/or the solder composition to the flux, as solder alloy and/or solder composition:flux (mass ratio), is, for example, 70:30 to 90:10.

The above-described solder alloy and/or the above-described solder composition are/is contained, so that the above-described solder paste is capable of having excellent mechanical properties such as durability, crack resistance, and erosion resistance and furthermore, capable of suppressing the breakage of components.

The present invention includes an electronic circuit board including a soldering portion by the above-described solder paste.

That is, the above-described solder paste is preferably used in, for example, soldering (metal connection) of an electrode of an electronic circuit board such as an electrical and electronic device with an electronic component.

The electronic component is not particularly limited and an example thereof includes a known electronic component such as resistors, diodes, condensers, and transistors.

The above-described solder paste is used in soldering, so that in its soldering portion, the electronic circuit board is capable of having excellent mechanical properties such as durability, crack resistance, and erosion resistance and furthermore, capable of suppressing the breakage of components.

The usage of the above-described solder alloy and the above-described solder composition is not limited to the above-described solder paste and can be also used in, for example, the production of a resin flux cored solder connecting material. To be specific, for example, the above-described solder alloy and/or the above-described solder composition are/is formed into a linear shape with the above-described flux as a core by a known method (e.g., extrusion molding etc.), so that the resin flux cored solder connecting material can be also obtained.

Such a resin flux cored solder connecting material is also preferably used in, for example, soldering (metal connection) of an electronic circuit board such as an electrical and electronic device in the same manner as that of the solder paste.

EXAMPLES

The present invention will now be described in more detail by way of Examples and Comparative Examples. However, the present invention is not limited to the following Examples. Values in Examples shown below can be replaced with the values (that is, upper limit value or lower limit value) described in the embodiment.

Examples 1 to 18 and Comparative Examples 1 to 12

Preparation of Solder Alloy

The powder of each of the metals and that of the metal oxide and/or the metal nitride described in Tables 1 to 2 were mixed at the mixing ratio described in Tables 1 to 2 and each of the obtained metal mixtures was melted to be unified in a melting furnace, thereby preparing solder alloys (Examples 1 to 16, Comparative Examples 1 to 12) and solder compositions (Examples 17 to 18).

The mixing ratio of tin (Sn) in each of the mixing formulations in Examples and Comparative Examples is a remaining ratio obtained by subtracting the mixing ratio (mass %) of the metals (silver (Ag), copper (Cu), indium (In), bismuth (Bi), antimony (Sb), nickel (Ni), and cobalt (Co)) described in Tables 1 to 2 and the mixing ratio (mass %) of the metal oxide and/or the metal nitride.

The solder alloy in Example 1 is obtained by blending each of the metals of Ag, Cu, In, Bi, Ni, and Co at a ratio shown in Table 1 and defining the remaining content as Sn.

Examples 2 to 4 are an example of the formulation in which the mixing ratio of Ag is increased or decreased with respect to the formulation in Example 1.

Examples 5 to 6 are an example of the formulation in which the mixing ratio of Cu is increased or decreased with respect to the formulation in Example 1.

Examples 7 to 8 are an example of the formulation in which the mixing ratio of In is increased or decreased with respect to the formulation in Example 1.

Examples 9 to 10 are an example of the formulation in which the mixing ratio of Bi is increased or decreased with respect to the formulation in Example 1.

Examples 11 to 12 are an example of the formulation in which the mixing ratio of Ni is increased or decreased with respect to the formulation in Example 1.

Examples 13 to 14 are an example of the formulation in which the mixing ratio of Co is increased or decreased with respect to the formulation in Example 1.

Examples 15 to 16 are an example of the formulation in which Sb is further blended and the mixing ratio of Sb is increased or decreased with respect to the formulation in Example 1.

Example 17 is an example of the formulation in which zirconium oxide ($ZrO_2$), which is metal oxide, is further blended to the formulation in Example 1 to obtain a solder composition.

Example 18 is an example of the formulation in which silicon dioxide ($SiO_2$), which is metal oxide, is further blended to the formulation in Example 1 to obtain a solder composition.

Comparative Examples 1 to 2 are an example of the formulation in which the mixing ratio of Ag is increased or decreased to obtain excessive or insufficient Ag with respect to the formulation in Example 1.

Comparative Examples 3 to 4 are an example of the formulation in which the mixing ratio of Cu is increased or decreased to obtain excessive or insufficient Cu with respect to the formulation in Example 1.

Comparative Examples 5 to 6 are an example of the formulation in which the mixing ratio of In is increased or decreased to obtain excessive or insufficient In with respect to the formulation in Example 1.

Comparative Examples 7 to 8 are an example of the formulation in which the mixing ratio of Bi is increased or decreased to obtain excessive or insufficient Bi with respect to the formulation in Example 1.

Comparative Examples 9 to 10 are an example of the formulation in which the mixing ratio of Ni is increased or decreased to obtain excessive or insufficient Ni with respect to the formulation in Example 1.

Comparative Examples 11 to 12 are an example of the formulation in which the mixing ratio of Co is increased or decreased to obtain excessive or insufficient Co with respect to the formulation in Example 1.

Preparation of Solder Paste

The obtained solder alloy or solder composition was powdered so that the particle size thereof was 25 to 38 μm. The obtained powder of the solder alloy was mixed with known flux, thereby obtaining a solder paste.

Evaluation of Solder Paste

The obtained solder paste was printed in a chip component-mounted print board and a chip component was mounted thereon by a reflow method. The printing conditions of the solder paste at the time of mounting, the size of the chip component, and the like were appropriately set in accordance with each of the evaluations to be described later.

TABLE 1

| No. | Mixing Formulation (Mass %) | | | | | | | |
|---|---|---|---|---|---|---|---|---|
| | Ag | Cu | In | Bi | Sb | Ni | Co | Oxide |
| Ex. 1 | 3.5 | 0.5 | 7.0 | 2.5 | — | 0.05 | 0.005 | — |
| Ex. 2 | 2.0 | 0.5 | 7.0 | 2.5 | — | 0.05 | 0.005 | — |
| Ex. 3 | 4.0 | 0.5 | 7.0 | 2.5 | — | 0.05 | 0.005 | — |
| Ex. 4 | 4.5 | 0.5 | 7.0 | 2.5 | — | 0.05 | 0.005 | |
| Ex. 5 | 3.5 | 0.1 | 7.0 | 2.5 | — | 0.05 | 0.005 | — |
| Ex. 6 | 3.5 | 1.0 | 7.0 | 2.5 | — | 0.05 | 0.005 | — |
| Ex. 7 | 3.5 | 0.5 | 6.3 | 2.5 | — | 0.05 | 0.005 | — |
| Ex. 8 | 3.5 | 0.5 | 10.0 | 2.5 | — | 0.05 | 0.005 | — |
| Ex. 9 | 3.5 | 0.5 | 7.0 | 0.5 | — | 0.05 | 0.005 | — |
| Ex. 10 | 3.5 | 0.5 | 7.0 | 4.8 | — | 0.05 | 0.005 | — |
| Ex. 11 | 3.5 | 0.5 | 7.0 | 2.5 | — | 0.01 | 0.005 | — |
| Ex. 12 | 3.5 | 0.5 | 7.0 | 2.5 | — | 0.15 | 0.005 | — |
| Ex. 13 | 3.5 | 0.5 | 7.0 | 2.5 | — | 0.05 | 0.001 | — |
| Ex. 14 | 3.5 | 0.5 | 7.0 | 2.5 | — | 0.05 | 0.008 | — |
| Ex. 15 | 3.5 | 0.5 | 7.0 | 2.5 | 0.4 | 0.05 | 0.005 | — |
| Ex. 16 | 3.5 | 0.5 | 7.0 | 2.5 | 10.0 | 0.05 | 0.005 | — |
| Ex. 17 | 3.5 | 0.5 | 7.0 | 2.5 | — | 0.05 | 0.005 | ZrO2/0.01 |
| Ex. 18 | 3.5 | 0.5 | 7.0 | 2.5 | — | 0.05 | 0.005 | SiO2/0.01 |

TABLE 2

| | Mixing Formulation (mass %) | | | | | | | |
|---|---|---|---|---|---|---|---|---|
| No. | Ag | Cu | In | Bi | Sb | Ni | Co | Oxide |
| Comp. Ex. 1 | 0.5 | 0.5 | 7.0 | 2.5 | — | 0.05 | 0.005 | — |
| Comp. Ex. 2 | 5.5 | 0.5 | 7.0 | 2.5 | — | 0.05 | 0.005 | — |
| Comp. Ex. 3 | 3.5 | 0.01 | 7.0 | 2.5 | — | 0.05 | 0.005 | — |
| Comp. Ex. 4 | 3.5 | 2.0 | 7.0 | 2.5 | — | 0.05 | 0.005 | — |
| Comp. Ex. 5 | 3.5 | 0.5 | 6.2 | 2.5 | — | 0.05 | 0.005 | — |
| Comp. Ex. 6 | 3.5 | 0.5 | 11.0 | 2.5 | — | 0.05 | 0.005 | — |
| Comp. Ex. 7 | 3.5 | 0.5 | 7.0 | 0.0 | — | 0.05 | 0.005 | — |
| Comp. Ex. 8 | 3.5 | 0.5 | 7.0 | 5.5 | — | 0.05 | 0.005 | — |
| Comp. Ex. 9 | 3.5 | 0.5 | 7.0 | 2.5 | — | 0.001 | 0.005 | — |
| Comp. Ex. 10 | 3.5 | 0.5 | 7.0 | 2.5 | — | 0.30 | 0.005 | — |
| Comp. Ex. 11 | 3.5 | 0.5 | 7.0 | 2.5 | — | 0.05 | Absence | — |
| Comp. Ex. 12 | 3.5 | 0.5 | 7.0 | 2.5 | — | 0.05 | 0.050 | — |

Evaluation

<Crack Resistance (Size of Intermetallic Compound Structure)>

Each of the solder pastes (0.3 g) obtained in Examples and Comparative Examples was applied to a central portion (region of about 5 mm×5 mm) of a copper plate having a thickness of 0.3 mm and a size of 2.5 centimeters square. The test piece obtained in this manner was heated in a reflow furnace. The heating conditions by the reflow furnace were as follows: preheating of 150 to 180° C. for 90 seconds and peak temperature of 250° C. Also, the time for the furnace being at 220° C. or more was adjusted to be 120 seconds and the cooling rate at the time when the temperature decreased from the peak temperature until 200° C. was set to be 0.5 to 1.5° C./sec. The reflow conditions were more severe than general reflow conditions and were conditions in which an intermetallic compound was easily deposited in the tin of the solder.

The test piece undergoing the reflow was cut and its cross section was polished. Next, the cross section after polishing was observed with a scanning electron microscope, so that the size of the intermetallic compound structure that was deposited in the solder after the reflow was measured and the obtained results were ranked in accordance with the following criteria. The smaller the size of the intermetallic compound structure is, the more excellent the crack resistance is.

A: A size of the observed maximum structure was less than 50 μm.

B: A size of the observed maximum structure was 50 μm or more and 100 μm or less.

C: A size of the observed maximum structure was above 100 μm.

<Erosion Resistance (Cu Erosion)>

Each of the solder alloys obtained in Examples and Comparative Examples was brought into a melted state in a solder tank that was set to be 260° C. Thereafter, a comb-shaped electrode substrate having a copper wire was immersed in the melted solder for five seconds. As a comb-shaped electrode substrate having a copper wire, a test substrate: "Comb-Shaped Electrode Substrate 2 Form" specified in Annex 3 "Insulation Resistance Test" of JIS Z 3284-1994 "Solder Paste" was used.

The operation of immersing the comb-shaped substrate in the melted solder was repeatedly performed and the immersion times until the size of the copper wire in the comb-shaped substrate was reduced by half was measured. In view of reliability of electronic circuit, the immersion times should be the times in which the size of the copper wire was not reduced by half even in the case of the immersion times of four times or more. A case where the size thereof was not reduced by half at the immersion times of four times was evaluated as "A". A case where the size thereof was reduced by half at the immersion times of three times or less was evaluated as "C".

<Durability (Solder Life)•Breakage of Component>

Each of the solder pastes obtained in Examples and Comparative Examples was printed in a chip component-mounted print board and a chip component was mounted thereon by a reflow method. The printing film thickness of the solder paste was adjusted using a metal mask having a thickness of 150 μm. After the printing of the solder paste, the chip component having a 3216 size (32 mm×16 mm) was mounted on a predetermined position of the above-described print board to be heated in a reflow furnace and then, the chip component was mounted thereon. The reflow conditions were set as follows: preheating of 170 to 190° C., peak temperature of 245° C., time for the furnace being at 220° C. or more to be 45 seconds, and cooling rate at the time when the temperature decreased from the peak temperature until 200° C. to be 3 to 8° C./sec.

Furthermore, the above-described print board was subjected to a cooling/heating cycle test in which it was retained under the environment of −40° C. for 30 minutes and next, retained under the environment of 125° C. for 30 minutes.

As for the print board in which the cooling/heating cycles were repeated by 1500, 2000, and 2500 cycles, each of the solder portions thereof was cut and its cross section was polished. The cross section after polishing was observed with an X-ray image to evaluate if a crack that occurred in a solder fillet portion completely crossed the fillet portion or not. The results were ranked in accordance with the following criteria. The number of evaluation chips in each cycle was 20.

A: A crack completely crossing the fillet portion did not occur until 2500 cycles.

B: A crack completely crossing the fillet portion occurred between 1501 and 2500 cycles.

C: A crack completely crossing the fillet portion occurred in less than 1500 cycles.

Also, ranking was performed based on whether a crack occurred or not in the chip component at the time of confirming the cross section after the cooling/heating cycles.

A: A crack did not occur in the chip component.

C: A crack occurred in the chip component.

<Comprehensive Evaluation>

As grading for each of the evaluations of "Crack Resistance (Size of Solder Structure)", "Erosion Resistance (Cu Erosion)", "Durability (Solder Life)", and "Breakage of Component", evaluation "A" was defined as two points with evaluation "B" as one point and evaluation "C" as zero point. Next, the total grading in each evaluation item was calculated. Based on the total grading, each of the solder pastes in Examples and Comparative Examples was comprehensively evaluated in accordance with the following criteria.

A: Highly excellent (the total grading was seven points or more and evaluation "C" was not included).

B: Good (the total grading was five points or six points and evaluation "C" was not included).

C: Bad (the total grading was four points or less or at least one evaluation "C" was included).

The evaluation results are shown in Tables 3 to 4.

TABLE 3

| No. | Crack Resistance | Erosion Resistance | Durability | Breakage of Component | Total Evaluation Comprehensive Evaluation |
|---|---|---|---|---|---|
| Ex. 1 | A | A | B | A | 7, A |
| Ex. 2 | A | A | B | A | 7, A |
| Ex. 3 | B | A | A | A | 7, A |
| Ex. 4 | B | B | B | A | 5, B |
| Ex. 5 | A | B | A | A | 7, A |
| Ex. 6 | A | A | B | A | 7, B |
| Ex. 7 | A | A | B | A | 7, A |
| Ex. 8 | B | A | B | A | 6, B |
| Ex. 9 | A | A | B | A | 7, A |
| Ex. 10 | A | A | B | A | 7, A |
| Ex. 11 | A | A | B | A | 7, B |
| Ex. 12 | A | A | B | A | 7, B |
| Ex. 13 | A | A | B | A | 7, B |
| Ex. 14 | A | A | B | A | 7, A |
| Ex. 15 | A | A | A | A | 8, A |
| Ex. 16 | A | A | A | A | 8, A |
| Ex. 17 | A | A | A | A | 8, A |
| Ex. 18 | A | A | A | A | 8, A |

TABLE 4

| No. | Crack Resistance | Erosion Resistance | Durability | Breakage of Component | Total Evaluation Comprehensive Evaluation |
|---|---|---|---|---|---|
| Comp. Ex. 1 | A | C | C | A | 4, C |
| Comp. Ex. 2 | C | A | C | C | 2, C |
| Comp. Ex. 3 | C | C | C | A | 2, C |
| Comp. Ex. 4 | C | A | C | C | 2, C |
| Comp. Ex. 5 | A | A | A | C | 6, C |
| Comp. Ex. 6 | C | A | C | A | 4, C |
| Comp. Ex. 7 | A | A | C | A | 6, C |
| Comp. Ex. 8 | B | A | B | C | 4, C |
| Comp. Ex. 9 | C | C | B | A | 3, C |
| Comp. Ex. 10 | C | A | B | C | 3, C |
| Comp. Ex. 11 | C | C | B | A | 3, C |
| Comp. Ex. 12 | C | A | B | C | 3, C |

<Production of Electronic Circuit Board>

In the above-described Examples and Comparative Examples, in evaluation of solder paste, chip components in various sizes of 3216 size (32 mm×16 mm) and 2012 size (20 mm×12 mm) were mounted.

As is clear from the above-described evaluation results, by using the solder pastes in Examples described above, good results were obtained in each of the evaluations such as size of solder structure, void suppression, Cu erosion, and solder life.

That is, by using each of the solder pastes in Examples described above, an electronic circuit board corresponding to various sizes of chip components and having excellent connection reliability of chip components can be produced.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The solder alloy, the solder composition, and the solder paste of the present invention are used in an electronic circuit board used for electrical and electronic devices or the like.

The invention claimed is:
1. A solder alloy consisting of:
tin, silver, copper, bismuth, nickel, cobalt, and indium, and optionally antimony, wherein
with respect to the total amount of the solder alloy,
the content ratio of the silver is 2 mass % or more and 5 mass % or less;
the content ratio of the copper is 0.1 mass % or more and 1 mass % or less;
the content ratio of the bismuth is 0.5 mass % or more and 4.8 mass % or less;
the content ratio of the nickel is 0.01 mass % or more and 0.15 mass % or less;
the content ratio of the cobalt is 0.001 mass % or more and 0.008 mass % or less;
the content ratio of the indium is 6.3 mass % or more and 10 mass % or less;
the content ratio of antimony, when present, being 0.4 mass % or more and 10 mass % or less; and
the content ratio of the tin is the remaining ratio, and
wherein the solder alloy satisfies
1) a crack resistance ranking of A or B, wherein ranking A corresponds to A: a size of an observed maximum structure is less than 50 μm and ranking B corresponds to B: a size of an observed maximum structure is 50 μm or more and 100 μm or less;
2) a durability ranking of A or B, wherein ranking A corresponds to A: a crack completely crossing a solder fillet portion does not occur until 2500 cycles and ranking B corresponds to B: a crack completely crossing a solder fillet portion occurs between 1501 and 2500 cycles;
3) a breakage of component ranking of A, wherein ranking A corresponds to A: a crack does not occur in a chip component.
2. A solder alloy consisting of:
tin, silver, copper, bismuth, nickel, cobalt, indium, and antimony, wherein
with respect to the total amount of the solder alloy,
the content ratio of the silver is 2 mass % or more and 5 mass % or less;
the content ratio of the copper is 0.1 mass % or more and 1 mass % or less;
the content ratio of the bismuth is 0.5 mass % or more and 4.8 mass % or less;
the content ratio of the nickel is 0.01 mass % or more and 0.15 mass % or less;
the content ratio of the cobalt is 0.001 mass % or more and 0.008 mass % or less;
the content ratio of the indium is 6.3 mass % or more and 10 mass % or less;
the content ratio of antimony is 0.4 mass % or more and 10 mass % or less; and
the content ratio of the tin is the remaining ratio, and
wherein the solder alloy satisfies
1) a crack resistance ranking of A or B, wherein ranking A corresponds to A: a size of an observed maximum structure is less than 50 μm and ranking B corresponds to B: a size of an observed maximum structure is 50 μm or more and 100 μm or less;

2) a durability ranking of A or B, wherein ranking A corresponds to A: a crack completely crossing a solder fillet portion does not occur until 2500 cycles and ranking B corresponds to B: a crack completely crossing a solder fillet portion occurs between 1501 and 2500 cycles;
3) a breakage of component ranking of A, wherein ranking A corresponds to A: a crack does not occur in a chip component.

* * * * *